(12) United States Patent
Jang et al.

(10) Patent No.: US 11,658,259 B2
(45) Date of Patent: *May 23, 2023

(54) LIGHT EMITTING DEVICE

(71) Applicant: SAMSUNG ELECTRONICS CO., LTD., Suwon-si (KR)

(72) Inventors: Jeonghwan Jang, Suwon-si (KR); Jae-Yoon Kim, Yongin-si (KR); Sungwon Ko, Suwon-si (KR); Junghee Kwak, Hwaseong-si (KR); Sangseok Lee, Seoul (KR); Suyeol Lee, Seongnam-si (KR); Seungwan Chae, Yongin-si (KR); Pun Jae Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/589,192

(22) Filed: Jan. 31, 2022

(65) Prior Publication Data

US 2022/0158023 A1  May 19, 2022

Related U.S. Application Data

(63) Continuation of application No. 16/844,616, filed on Apr. 9, 2020, now Pat. No. 11,239,385.

(30) Foreign Application Priority Data

Aug. 20, 2019 (KR) .................. 10-2019-0101797

(51) Int. Cl.
*H01L 33/40* (2010.01)
*H01L 33/24* (2010.01)
(Continued)

(52) U.S. Cl.
CPC .......... *H01L 33/0016* (2013.01); *H01L 33/24* (2013.01); *H01L 33/405* (2013.01); *H01L 33/62* (2013.01)

(58) Field of Classification Search
CPC ... H01L 33/0016; H01L 33/24; H01L 33/405; H01L 33/62
See application file for complete search history.

(56) References Cited

U.S. PATENT DOCUMENTS 7,119,372 B2  10/2006  Stokes et al.
7,166,483 B2   1/2007  Liu et al.
(Continued)

*Primary Examiner* — Mark W Tornow
(74) *Attorney, Agent, or Firm* — Sughrue Mion, PLLC

(57) ABSTRACT

A light emitting device is provided. The light emitting device includes a first semiconductor layer; a second semiconductor layer provided on a bottom surface of the first semiconductor layer; an active layer interposed between the first semiconductor layer and the second semiconductor layer; a dielectric layer provided on a bottom surface of the second semiconductor layer; a plurality of first n-contacts provided on a first etched surface of the first semiconductor layer; and a plurality of first p-contacts and a plurality of second p-contacts provided on the bottom surface of the second semiconductor layer. One first n-contact is disposed along a first edge region of the first semiconductor layer, one first p-contact is closer to the one first n-contact than one second p-contact, and an area of the one first p-contact is greater than an area of each of the second p-contacts.

20 Claims, 16 Drawing Sheets

(51) Int. Cl.
*H01L 33/62* (2010.01)
*H01L 33/00* (2010.01)

(56) References Cited

U.S. PATENT DOCUMENTS

| | | | |
|---|---|---|---|
| 9,461,210 B2 | 10/2016 | Takenaga et al. | |
| 10,014,442 B2 | 7/2018 | Kim et al. | |
| 10,270,018 B2 | 4/2019 | Jang et al. | |
| 11,239,385 B2* | 2/2022 | Jang | H01L 33/405 |
| 2006/0289886 A1* | 12/2006 | Sakai | H01L 33/387 |
| | | | 257/E33.068 |
| 2007/0267640 A1* | 11/2007 | Lee | H01L 33/14 |
| | | | 257/E33.068 |
| 2008/0043795 A1* | 2/2008 | Hsueh | H01L 33/10 |
| | | | 372/45.01 |
| 2010/0012971 A1* | 1/2010 | Hiraoka | H01L 33/42 |
| | | | 257/E33.025 |
| 2010/0252855 A1 | 10/2010 | Kamai | |
| 2015/0280071 A1* | 10/2015 | Takenaga | H01L 33/382 |
| | | | 257/99 |
| 2019/0027649 A1 | 1/2019 | Yoon et al. | |
| 2019/0067525 A1 | 2/2019 | Xu et al. | |

\* cited by examiner

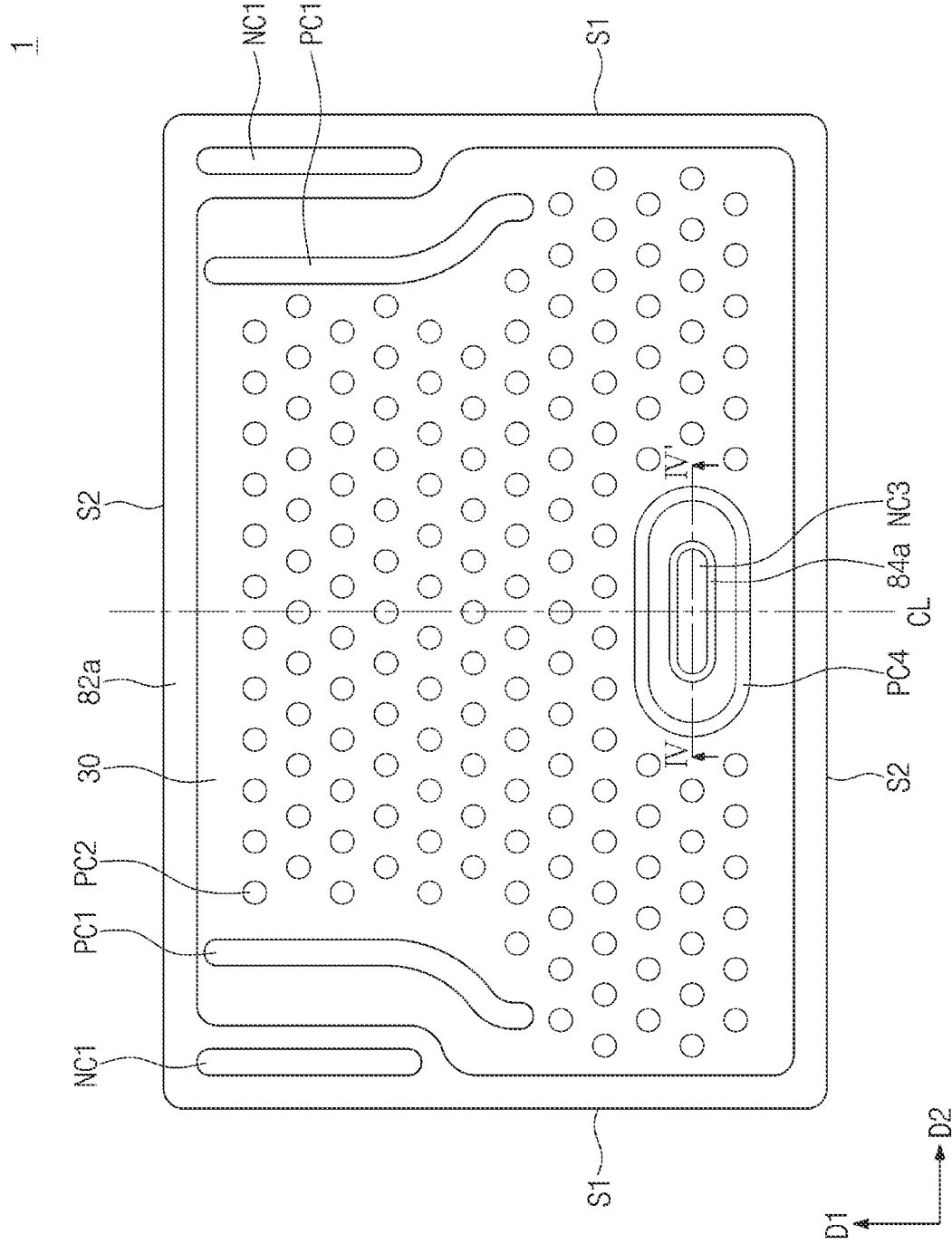

LIGHT EMITTING DEVICE

CROSS-REFERENCE TO THE RELATED APPLICATION

This application is a Continuation Application of U.S. application Ser. No. 16/844,616, filed on Apr. 9, 2020, which claims priority from Korean Patent Application No. 10-2019-0101797, filed on Aug. 20, 2019 in the Korean Intellectual Property Office, the disclosure of which is incorporated herein by reference in its entirety.

BACKGROUND

1. Field

Devices and methods consistent with example embodiments relate to a light emitting device, and more particularly, to a light emitting device with increased reliability.

2. Related Art

Light emitting devices, such as light emitting diodes, are apparatus in which light is emitted from materials included therein. Light emitting devices emit light converted from energy due to recombination of electrons and holes contained in semiconductors. Such light emitting devices are currently in widespread use as illumination, display devices, and light sources, and development thereof have been accelerated. Light emitting packages are provided to implement light emitting devices to be suitable for use in light emitting apparatuses. As light emitting devices become wider in their application, technology is required to increase light extraction efficiency and reliability of light emitting packages.

SUMMARY

Some example embodiments provide a light emitting device with increased reliability.

Some example embodiments provide a light emitting device with improved light extraction efficiency.

Example embodiments of the present disclosure are not limited to the mentioned above, and aspects which have not been mentioned above will be clearly understood to those skilled in the art from the following description.

According to some example embodiments, a light emitting device includes a first semiconductor layer; a second semiconductor layer provided on a bottom surface of the first semiconductor layer; an active layer interposed between the first semiconductor layer and the second semiconductor layer; a dielectric layer provided on a bottom surface of the second semiconductor layer; a plurality of first n-contacts provided on a first etched surface of the first semiconductor layer; and a plurality of first p-contacts and a plurality of second p-contacts provided on the bottom surface of the second semiconductor layer. When viewed in plan, one first n-contact of the plurality of first n-contacts is disposed along a first edge region of the first semiconductor layer. One first p-contact of the plurality of first p-contacts is closer to the one first n-contact than one second p-contact of the plurality of second p-contacts. When viewed in plan, an area of the one first p-contact is greater than an area of each of the plurality of second p-contacts.

According to some example embodiments, a light emitting device includes a first semiconductor layer; a second semiconductor layer provided on a bottom surface of the first semiconductor layer; an active layer interposed between the first semiconductor layer and the second semiconductor layer; a dielectric layer provided on a bottom surface of the second semiconductor layer; a first n-contact provided on a first etched surface of the first semiconductor layer; and a first p-contact and a plurality of second p-contacts provided on the bottom surface of the second semiconductor layer. When viewed in plan, the first n-contact is disposed in a central region of the first semiconductor layer. The first p-contact is closer to the first n-contact than one second p-contact of the plurality of second p-contacts. When viewed in plan, an area of the first p-contact is greater than an area of each of the plurality of second p-contacts.

According to some example embodiments, a light emitting device includes a first semiconductor layer; a second semiconductor layer provided on a bottom surface of the first semiconductor layer; an active layer interposed between the first semiconductor layer and the second semiconductor layer; a transparent conductive layer provided on a bottom surface of the second semiconductor layer; a first electrode provided on a first etched surface of the first semiconductor layer; a second electrode provided on a bottom surface of the transparent conductive layer; a plurality of first n-contacts interposed between the first semiconductor layer and the first electrode; and a plurality of first p-contacts and a plurality of second p-contacts interposed between the transparent conductive layer and the second electrode. One first n-contact of the plurality of first n-contacts corresponds to a region where the first semiconductor layer is connected to the first electrode. One first p-contact of the plurality of first p-contacts corresponds to a region where the second semiconductor layer is connected through the transparent conductive layer to the second electrode. When viewed in plan, the one first n-contact is disposed along an edge region of the first semiconductor layer. The one first p-contact is interposed between one second p-contact, of the plurality of second p-contacts, and the one first n-contact. When viewed in plan, the one first p-contact curves around the one first n-contact.

BRIEF DESCRIPTION OF THE DRAWINGS

The above and other aspects and features will become more apparent by describing in detail example embodiments with reference to the attached drawings, in which:

FIG. 7A illustrates a plan view showing a light emitting module according to some example embodiments.

DETAILED DESCRIPTION

Figure 1:
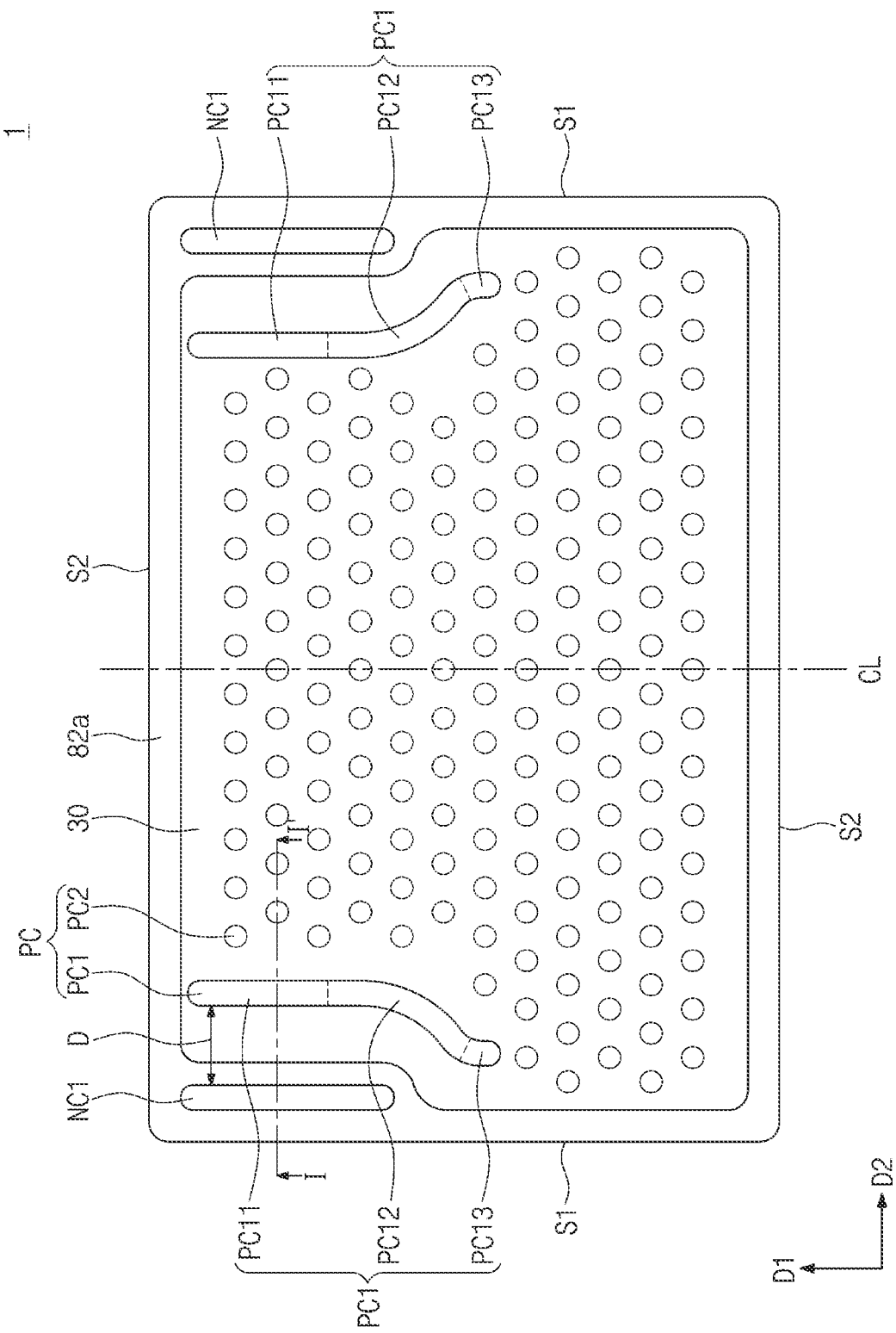
FIG. 1 illustrates a plan view showing a light emitting module according to some example embodiments.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. As used herein, the term "and/or" includes any and all combinations of one or more of the associated listed items. Like reference numerals may indicate like components.

Figure 2:
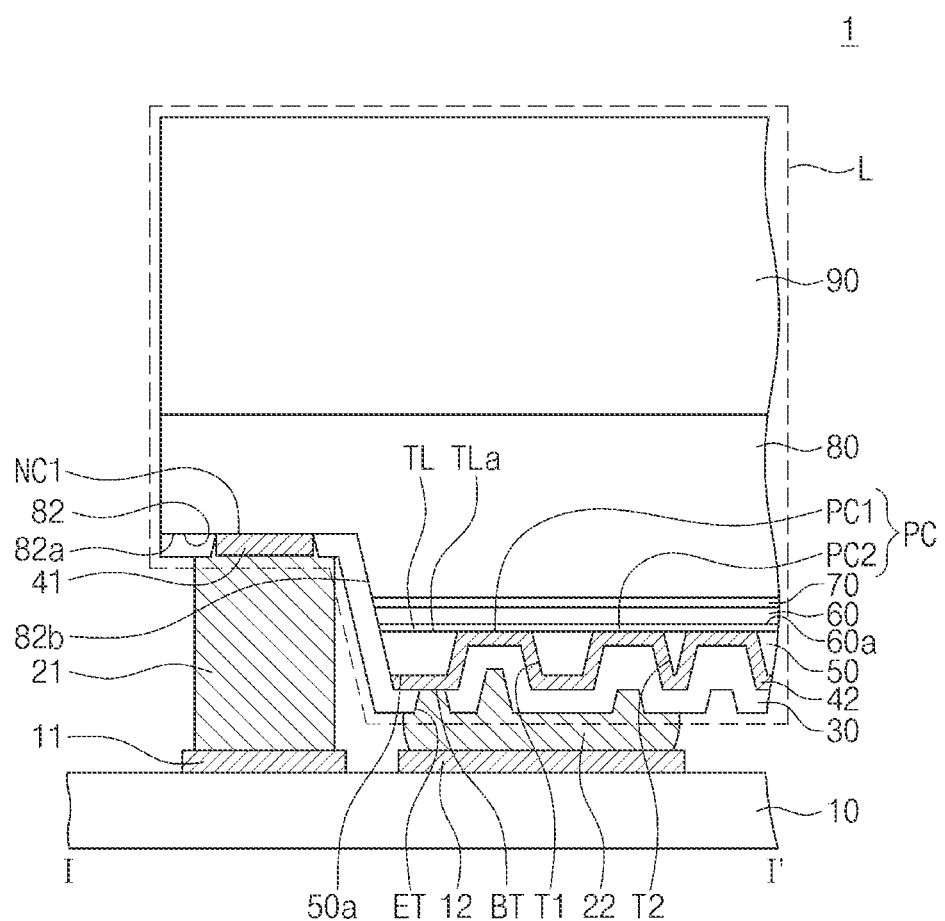
FIG. 2 illustrates a cross-sectional view taken along line I-I' of FIG. 1.

FIG. 1 illustrates a plan view showing a light emitting module according to some example embodiments. FIG. 2 illustrates a cross-sectional view taken along line I-I' of FIG. 1.

Referring to FIGS. 1 and 2, a light emitting module 1 may include a substrate 10, a first solder bump 21, a second solder bump 22, and a light emitting device L. The substrate 10 may include, for example, a printed circuit board (PCB). The substrate 10 may include a first connection pad 11 and a second connection pad 12 that are disposed on a top surface thereof. The first connection pad 11 and the second connection pad 12 may include a conductive material such as metal and may have electrical connection with connection lines provided in the substrate 10. The first solder bump 21 may be provided on a top surface of the first connection pad 11. The second solder bump 22 may be provided on a top surface of the second connection pad 12. The first solder bump 21 and the second solder bump 22 may include a conductive material such as metal. For example, the first solder bump 21 and the second solder bump 22 may include one or more of lead (Pb), tin (Sb), and gold (Au). The first solder bump 21 and the second solder bump 22 may electrically connect the light emitting device L to the substrate 10.

The light emitting device L may be mounted on the top surface of the substrate 10. The light emitting device L may include a growth substrate 90, a first semiconductor layer 80, an active layer 70, a second semiconductor layer 60, a transparent conductive layer TL, a dielectric layer 50, an insulating layer 30, a first electrode 41, and a second electrode 42.

The growth substrate 90 may be transparent to allow light to pass therethrough. The growth substrate 90 may have an uneven structure. For example, a bottom surface of the growth substrate 90 may be uneven. Therefore, the light emitting device L may increase in light extraction efficiency. The growth substrate 90 may include, for example, a sapphire substrate, but example embodiments are not limited thereto.

The first semiconductor layer 80, the active layer 70, and the second semiconductor layer 60 may be stacked on the bottom surface of the growth substrate 90. For example, the first semiconductor layer 80 may be provided on the bottom surface of the growth substrate 90. A buffer layer may further be interposed between the growth substrate 90 and the first semiconductor layer 80. The buffer layer may alleviate a lattice mismatch between the growth substrate 90 and the first semiconductor layer 80. The first semiconductor layer 80 may have a first conductivity type. The first semiconductor layer 80 may include gallium nitride (GaN) doped with an n-type dopant. The n-type dopant may include silicon (Si). The second semiconductor layer 60 may be provided on a bottom surface of the first semiconductor layer 80. The second semiconductor layer 60 may have a second conductivity type different from the first conductivity type. The second semiconductor layer 60 may include gallium nitride (GaN) doped with a p-type dopant. The p-type dopant may include magnesium (Mg).

The active layer 70 may be interposed between the first semiconductor layer 80 and the second semiconductor layer 60. The active layer 70 may include a material having a multiple quantum well (MQW) in which at least one quantum well layer and at least one quantum barrier layer are alternately stacked. For example, the active layer 70 may include layers of gallium nitride (GaN) and indium gallium nitride (InGaN) that are alternately stacked.

The transparent conductive layer TL may be provided on a bottom surface 60a of the second semiconductor layer 60. The transparent conductive layer TL may include a conductive material. For example, the transparent conductive layer TL may include one or more of indium tin oxide (InSnO), indium copper oxide (InCuO), and zinc oxide (ZnO). The transparent conductive layer TL may be transparent to allow light to pass therethrough. Therefore, the light emitting device L may increase in light extraction efficiency. The transparent conductive layer TL may be interposed between the second electrode 42 and the second semiconductor layer 60, thereby increasing electrical conductivity between the second electrode 42 and the second semiconductor layer 60.

The dielectric layer 50 may be provided on a bottom surface TLa of the transparent conductive layer TL. The dielectric layer 50 may include a non-conductive material. For example, the dielectric layer 50 may include one or more of titanium oxide ($TiO_2$), silicon oxide ($SiO_2$), hafnium oxide ($HfO_2$), zirconium oxide ($ZrO_2$), cerium oxide ($CeO_2$), lanthanum oxide ($La_2O_3$), and aluminum oxide ($Al_2O_3$). For example, the dielectric layer 50 may include layers of titanium oxide ($TiO_2$) and silicon oxide ($SiO_2$) that are alternately stacked. The dielectric layer 50 may be etched such that first trenches T1 and second trenches T2 may be included. The first trenches T1 and the second trenches T2 may expose the second semiconductor layer 60.

The second electrode 42 may be provided on a bottom surface 50a of the dielectric layer 50 and the bottom surface TLa of the transparent conductive layer TL. For example, the second electrode 42 may conformally cover the bottom surface 50a of the dielectric layer 50, top and lateral surfaces of the first trenches T1, and top and lateral surfaces of the second trenches T2. The second electrode 42 may contact the bottom surface TLa of the transparent conductive layer TL, thereby forming p-contacts PC. The p-contacts PC may include first p-contacts PC1 and second p-contacts PC2. The second electrode 42 may be electrically connected to the second semiconductor layer 60 through the first p-contacts PC1 and the second p-contacts PC2. The second electrode 42 may include a conductive material such as metal. For example, the second electrode 42 may include silver (Ag).

When viewed in plan, edge regions of the first semiconductor layer 80, the active layer 70, the second semiconductor layer 60, the transparent conductive layer TL, and the dielectric layer 50 may be etched to form a first etching part 82. When viewed in plan, the first etching part 82 may surround the second semiconductor layer 60, the dielectric layer 50, the transparent conductive layer TL, and the active layer 70. The first etching part 82 may expose an inside of the first semiconductor layer 80, a lateral surface of the active layer 70, a lateral surface of the second semiconductor layer 60, a lateral surface of the transparent conductive layer TL, and a lateral surface of the dielectric layer 50. The first etching part 82 may have a top surface 82a and an inclined surface 82b. The first electrode 41 may be provided on the top surface 82a of the first etching part 82. The first electrode 41 may contact the first semiconductor layer 80, thereby forming first n-contacts NC1. The first electrode 41 may be electrically connected through the first n-contacts NC1 to the first semiconductor layer 80. The first electrode 41 may include a conductive material such as metal. For example, the first electrode 41 may include silver (Ag).

The insulating layer 30 may be provided on the bottom surface of the first semiconductor layer 80 and a bottom surface of the second electrode 42. For example, the insulating layer 30 may conformally cover the top surface 82a of the first etching part 82, the inclined surface 82b of the first etching part 82, and the second electrode 42. The insulating layer 30 may be etched on the top surface 82a of the first etching part 82. Therefore, a portion of the first semiconductor layer 80 may be exposed. The first electrode 41 may be formed on the exposed region. A portion of the insulating layer 30 may be etched to form an insulating layer trench ET. The insulating layer trench ET may externally expose a surface BT of the second electrode 42. The insulating layer 30 may protect a lower portion of the light emitting device L from external impact, and may insulate the first and second electrodes 41 and 42 from each other.

The first solder bump 21 may be interposed between a bottom surface of the first electrode 41 and the top surface of the first connection pad 11. The first solder bump 21 may contact the bottom surface of the first electrode 41, and thus may electrically connect the first electrode 41 to the first connection pad 11. The second solder bump 22 may be interposed between the second electrode 42 and the second connection pad 12. The second solder bump 22 may extend into the insulating layer trench ET to come into contact with the surface BT of the second electrode 42. Therefore, the second electrode 42 and the second solder bump 22 may be electrically connected to each other through the surface BT of the second electrode 42. The second solder bump 22 may electrically connect the second electrode 42 to the second connection pad 12. In this description, the phrase "electrically connected/coupled" may include "directly connected/coupled" or "indirectly connected/coupled through other conductive component(s)."

As shown in FIG. 1, the light emitting device L may have the first n-contacts NC1 and the p-contacts PC. The p-contacts PC may include the first p-contacts PC1 and the second p-contacts PC2. The p-contacts PC may be regions where the second semiconductor layer 60 and the second electrode 42 are electrically connected to each other. When viewed in plan, the light emitting device L may have a pair of first sides S1 and a pair of second sides S2. A first direction D1 may be parallel to the first sides S1 of the light emitting device L. A second direction D2 may be parallel to the second sides S2 of the light emitting device L and perpendicular to the first direction D1. When viewed in plan, one of the first n-contacts NC1 may be disposed adjacent to one of the first sides S1 of the light emitting device L. For example, the one of the first n-contacts NC1 may be disposed adjacent to a corner where one of the second sides S2 meets one of the first sides S1. The first n-contacts NC1 may each be shaped like a line. The line may have a shape which extends uniformly in one direction when viewed in plan. The one of the first n-contacts NC1 may extend in a direction opposite to the first direction D1, and may be spaced apart in the second direction D2 from one of the first sides S1. When viewed in plan, the one of the first n-contacts NC1 may be surrounded by the top surface 82a of the first etching part 82.

When viewed in plan, one of the first p-contacts PC1 may be close to and spaced apart in the second direction D2 from the one of the first n-contacts NC1. For example, the one of the first p-contacts PC1 and the one of the first n-contacts NC1 may be spaced apart at an interval D ranging between 1 µm and 100 µm. The one of the first p-contacts PC1 may have a curved line shape. For example, the one of the first p-contacts PC1 may include a first segment PC11, a second segment PC12, and a third segment PC13. The first segment PC11 may extend in a direction opposite to the first direction D1 to connect with the second segment PC12. The second segment PC12 may have a curved shape connected to an end of the first segment PC11. The third segment PC13 may have a curved shape connected to an end of the second segment PC12. Therefore, when viewed in plan, the one of the first p-contacts PC1 may have a shape that partially surrounds one of the first n-contacts NC1. Accordingly, the one of the first n-contacts NC1 may be disposed between the one of the first sides S1 and the one of the first p-contacts PC1.

Another of the first n-contacts NC1 may be disposed adjacent to the other of the first sides S1. Another of the first p-contacts PC1 may be disposed adjacent to the another of the first n-contacts NC1. For example, the one and another of the first n-contacts NC1 may be disposed symmetrically with each other about a central line CL. The one and another of the first p-contacts PC1 may be disposed symmetrically with each other about the central line CL.

When viewed in plan, second p-contacts PC2 may be disposed between the first p-contacts PC1. For example, the second p-contacts PC2 may be spaced apart from each other in rows and columns in the first and second directions D1 and D2 between the first p-contacts PC1. The second p-contacts PC2 may each have a circular shape when viewed in plan. No second p-contacts PC2 may be disposed between the one of the first n-contacts NC1 and the one of the first p-contacts PC1.

The active layer 70 may receive, via the solder bumps 21 and 22 and the electrodes 41 and 42, electrical signals applied through the substrate 10, the first connection pad 11, and the second connection pad 12. For example, current may flow toward either the first p-contacts PC1 or the second p-contacts PC2 through the first n-contacts NC1, the first semiconductor layer 80, the active layer 70, the second semiconductor layer 60, and the transparent conductive layer TL. Therefore, recombination of electrons and holes may occur in the active layer 70, thereby generating light. A decrease in resistance increases the flow of current. In this regard, current density of the p-contacts PC closer to the first n-contacts NC1 is greater than the p-contacts PC that are relatively farther from the first n-contacts NC1. Therefore, the first p-contacts PC1 may have greater current density than that of the second p-contacts PC2. The first p-contacts PC1 may be more vulnerable to overheating-induced damages than the second p-contacts PC2. According to some example embodiments, the curved shapes may cause the first p-contacts PC1 to have areas greater than that of each of the second p-contacts PC2, and as a result, the current density may decrease to prevent failure due to overheating.

The second electrode 42 may serve as a reflective layer. For example, the second electrode 42 may reflect a portion of light that is generated from the active layer 70 and is directed toward the second electrode 42, and then the reflected light may travel toward the growth substrate 90 and other portion of the light may be absorbed into the second electrode 42. An increase in amount of light absorbed into the second electrode 42 may reduce light extraction efficiency of the light emitting device L. When the dielectric layer 50 is interposed between the second electrode 42 and the active layer 70, the amount of light absorbed into the second electrode 42 may decrease to reduce loss of reflection compared to a case where no dielectric layer 50 is present. According to some embodiments, the dielectric layer 50 may be included between the second electrode 42 and the active layer 70 such that high light extraction efficiency may be established.

When a light emitting device includes the dielectric layer 50, the second electrode 42 and the second semiconductor layer 60 may have therebetween the dielectric layer 50 to limit areas of the p-contacts PC where the second electrode 42 is electrically connected to the second semiconductor layer 60. In this case, the p-contacts PC may have large current density compared to a case where no dielectric layer 50 is included, which may increase the possibility of the occurrence of failure due to overheating. A light emitting device according to some embodiments may include a p-contact whose current density is the largest due to the proximity to an n-contact may be structurally different from other p-contacts, which may result in an improvement of failure caused by high current density.

Figure 3:
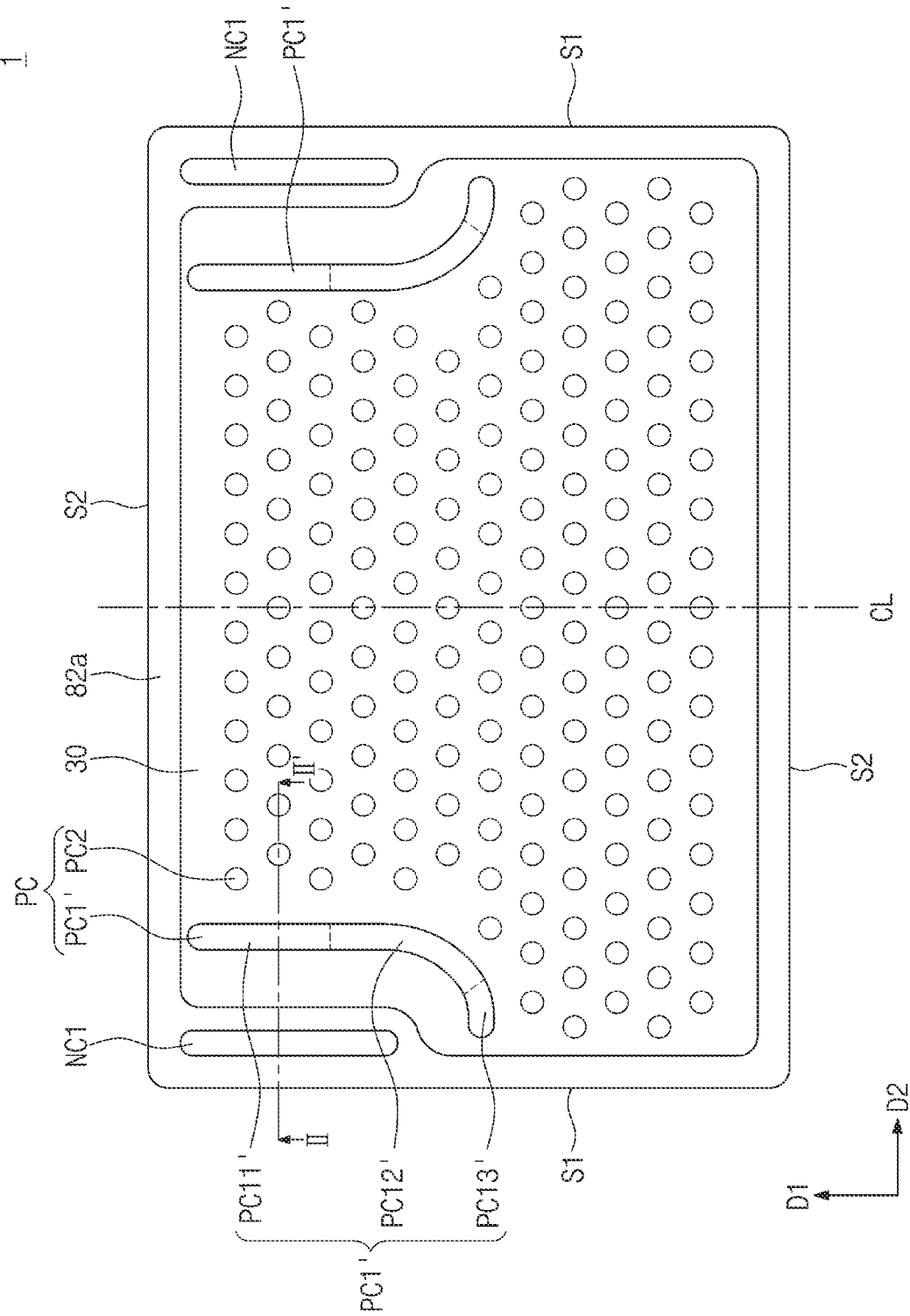
FIG. 3 illustrates a plan view showing a light emitting module according to some example embodiments.
Figure 4:
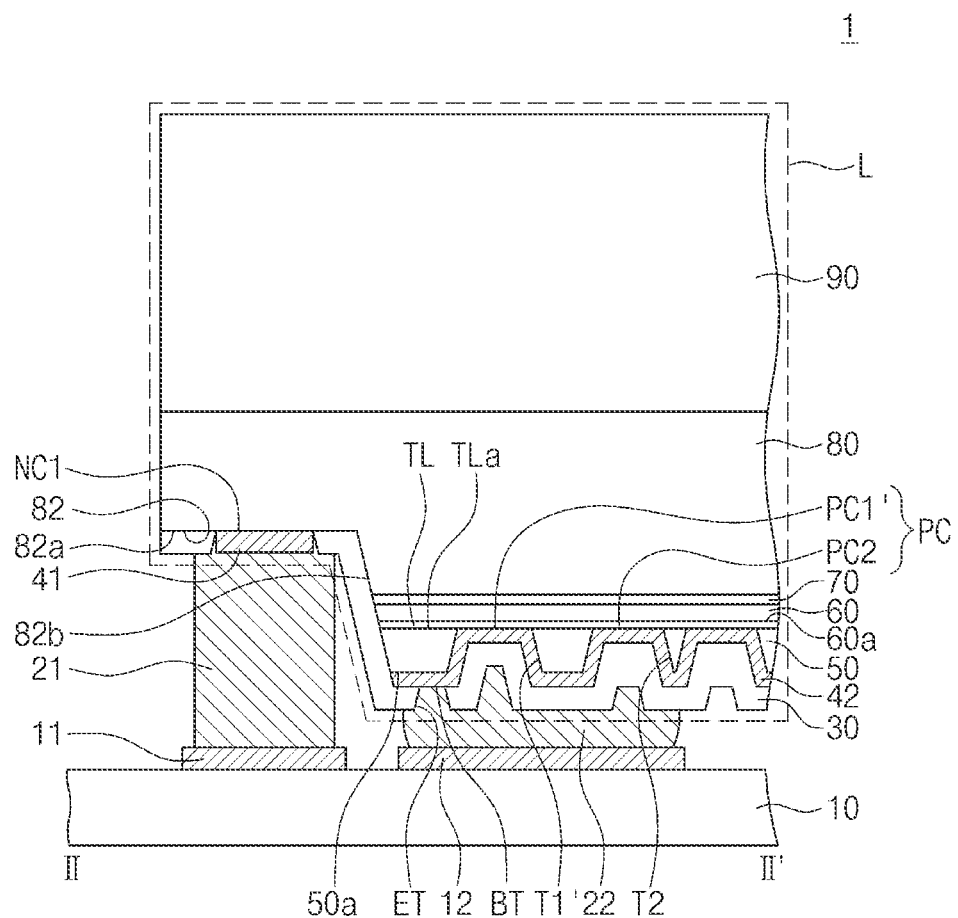
FIG. 4 illustrates a cross-sectional view taken along line II-II' of FIG. 3.

FIG. 3 illustrates a plan view showing a light emitting module according to some example embodiments. FIG. 4 illustrates a cross-sectional view taken along line II-II' of FIG. 3. A duplicate description will be omitted below.

Referring to FIGS. 3 and 4, a light emitting module 1 may include a substrate 10, a first solder bump 21, a second solder bump 22, and a light emitting device L. The substrate 10, the first solder bump 21, and the second solder bump 22 may be substantially the same as those discussed above with reference to FIGS. 1 and 2.

The light emitting device L may include a growth substrate 90, a first semiconductor layer 80, an active layer 70, a second semiconductor layer 60, a transparent conductive layer TL, a dielectric layer 50, an insulating layer 30, a first electrode 41, and a second electrode 42. The growth substrate 90, the first semiconductor layer 80, the active layer 70, the second semiconductor layer 60, the transparent conductive layer TL, the dielectric layer 50, the insulating layer 30, and the first electrode 41 may be substantially the same as those discussed above with reference to FIGS. 1 and 2.

The second electrode 42 may be provided on the bottom surface 50a of the dielectric layer 50 and the bottom surface TLa of the transparent conductive layer TL. For example, the second electrode 42 may conformally cover the bottom surface 50a of the dielectric layer 50, top and lateral surfaces of first trenches T1', and the top and lateral surfaces of second trenches T2. The second electrode 42 may contact the bottom surface TLa of the transparent conductive layer TL, thereby forming p-contacts PC. The p-contacts PC may include first p-contacts PC1' and second p-contacts PC2. The second electrode 42 may be electrically connected to the second semiconductor layer 60 through the first p-contacts PC1' and the second p-contacts PC2.

As shown in FIG. 3, the light emitting device L may have first n-contacts NC1 and the p-contacts PC. The p-contacts PC may include the first p-contacts PC1' and the second p-contacts PC2. The first n-contacts NC1 may be the same as the first n-contacts NC1 discussed above with reference to FIG. 1. When viewed in plan, one of the first p-contacts PC1' may be close to and spaced apart in the second direction D2 from one of the first n-contacts NC1. The one of the first p-contacts PC1' may have a curved line shape. For example, the one of the first p-contacts PC1' may include a first segment PC11', a second segment PC12', and a third segment PC13'. The first segment PC11' may extend in a direction opposite to the first direction D1 and may have connection with the second segment PC12'. The second segment PC12' may have a curved shape connected to an end of the first segment PC11'. The third segment PC13' may be connected to an end of the second segment PC12' and may extend in a direction opposite to the second direction D2. Therefore, when viewed in plan, the one of the first p-contacts PC1' may have a shape that partially surrounds one of the first n-contacts NC1. Accordingly, the one of the first n-contacts NC1 may be disposed between the one of the first sides S1 and the one of the first p-contacts PC1'.

Another of the first n-contacts NC1 may be disposed adjacent to the other of the first sides S1. Another of the first p-contacts PC1' may be disposed adjacent to the another of the first n-contacts NC1. For example, the one and another of the first n-contacts NC1 may be disposed symmetrically with each other about the central line CL. The one and another of the first p-contacts PC1' may be disposed symmetrically with each other about the central line CL. When viewed in plan, second p-contacts PC2 may be disposed between the first p-contacts PC1'. The second p-contacts PC2 may be substantially the same as the second p-contacts PC2 discussed above with reference to FIG. 1.

Figure 5:
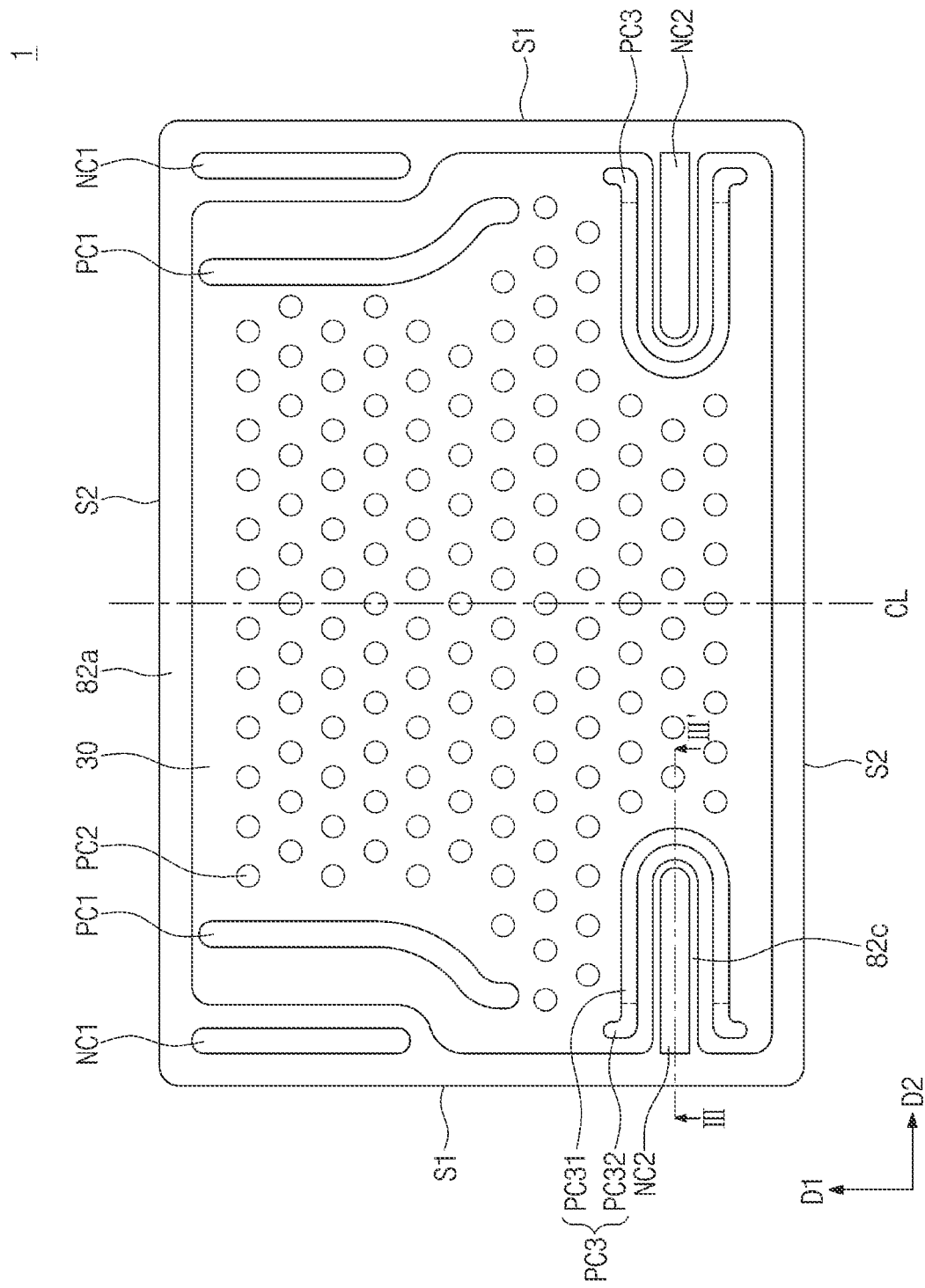
FIG. 5 illustrates a plan view showing a light emitting module according to some example embodiments.
Figure 6:
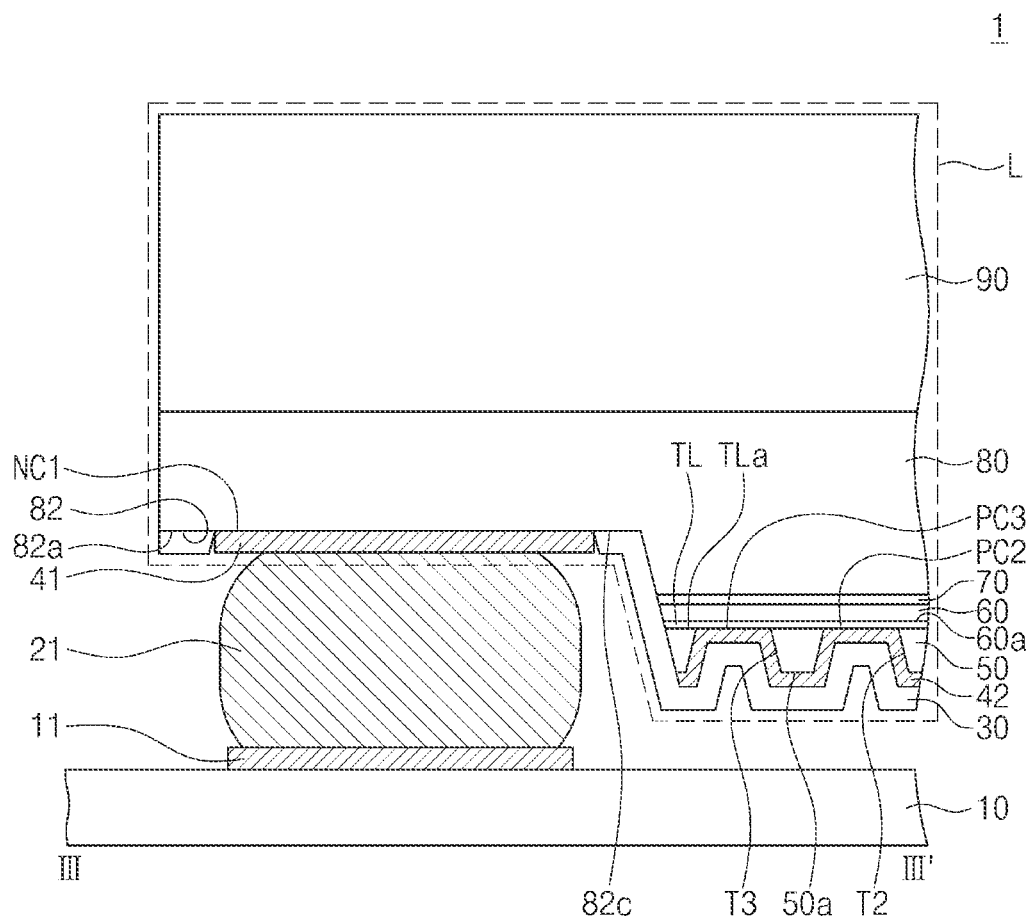
FIG. 6 illustrates a cross-sectional view taken along line III-III' of FIG. 5.

FIG. 5 illustrates a plan view showing a light emitting module according to some example embodiments. FIG. 6 illustrates a cross-sectional view taken along line III-III' of FIG. 5. A duplicate description will be omitted below.

Referring to FIGS. 5 and 6, a light emitting module 1 may include a substrate 10, a first solder bump 21, a second solder bump, and a light emitting device L. The substrate 10, the first solder bump 21, and the second solder bump may be substantially the same as those discussed above with reference to FIGS. 1 and 2.

The light emitting device L may include a growth substrate 90, a first semiconductor layer 80, an active layer 70, a second semiconductor layer 60, a transparent conductive layer TL, a dielectric layer 50, an insulating layer 30, a first electrode 41, and a second electrode 42. The growth substrate 90, the first semiconductor layer 80, the active layer 70, the second semiconductor layer 60, the transparent conductive layer TL, and the insulating layer 30 may be substantially the same as those discussed above with reference to FIGS. 1 and 2.

The dielectric layer 50 may be provided on the bottom surface TLa of the transparent conductive layer TL. The dielectric layer 50 may be etched such that third trenches T3 may further be included. The second electrode 42 may be provided on the bottom surface 50a of the dielectric layer 50 and the bottom surface TLa of the transparent conductive layer TL. For example, the second electrode 42 may conformally cover the bottom surface 50a of the dielectric layer 50, top and lateral surfaces of the third trenches T3, and the top and lateral surfaces of the second trenches T2. The second electrode 42 may contact the bottom surface TLa of the transparent conductive layer TL, thereby forming third p-contacts PC3. The third p-contacts PC3 may be regions where the second electrode is are electrically connected to the second semiconductor layer 60.

When viewed in plan, edge regions of the first semiconductor layer 80, the active layer 70, the second semiconductor layer 60, the transparent conductive layer TL, and the dielectric layer 50 may be etched to form a first etching part 82. The first etching part 82 may be similar to the first etching part 82 discussed above with reference to FIG. 1, but when viewed in plan, the top surface 82a of the first etching part 82 may further extend into a central region of the light emitting device L such that the first etching part 82 may additionally include a protruding surface 82c. The protruding surface 82c may be a portion of the top surface 82a of the first etching part 82. The first electrode 41 may be provided on the protruding surface 82c of the first etching part 82. The first electrode 41 may contact the first semiconductor layer 80, thereby forming second n-contacts NC2.

When viewed in plan, one of the second n-contacts NC2 may be disposed adjacent to one of the first sides S1 of the light emitting device L. The one of the second n-contacts NC2 may have, for example, an elongated line shape. For example, the one of the second n-contacts NC2 may extend in the second direction D2 and toward the central region of the light emitting device L.

When viewed in plan, one of the third p-contacts PC3 may be disposed adjacent to the one of the second n-contacts NC2. The one of the third p-contacts PC3 may have a curved line shape. For example, the one of the third p-contacts PC3 may include a first segment PC31 and second segments PC32. The first segment PC31 may have a shape that partially surrounds one of the second n-contacts NC2. The first segment PC31 may have a shape that corresponds to an alphabet character U. The one of the second n-contacts NC2 may be disposed between opposite ends of the first segment PC31. One of the second segments PC32 may be connected to one of the opposite ends of the first segment PC31 and may be curved in a direction away from one of the second n-contacts NC2. Another of the second segments PC32 may be connected to another of the opposite ends of the first segment PC31 and may be curved in a direction away from one of the second n-contacts NC2.

Another of the second n-contacts NC2 may be disposed adjacent to the other of the first sides S1. Another of the third p-contacts PC3 may be disposed adjacent to the another of the second n-contacts NC2. For example, the one and another of the second n-contacts NC2 may be disposed symmetrically with each other about the central line CL. Another of the second n-contacts NC2 may be disposed spaced apart in the second direction D2 from one of the first n-contacts NC1. The one and another of the third p-contacts PC3 may be disposed symmetrically with each other about the central line CL.

Figure 7B:
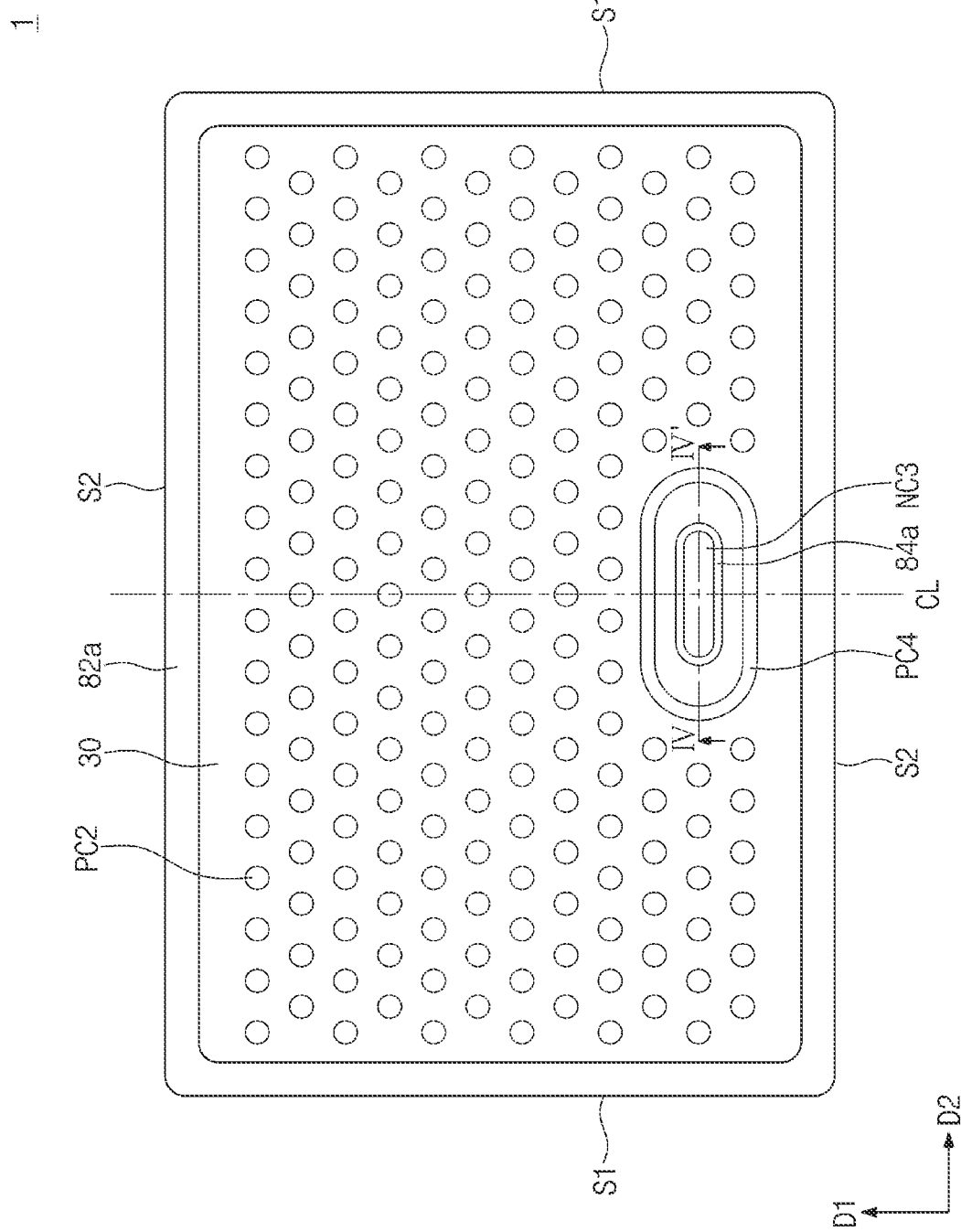
FIG. 7B illustrates a plan view showing a light emitting module according to some example embodiments.
Figure 8:
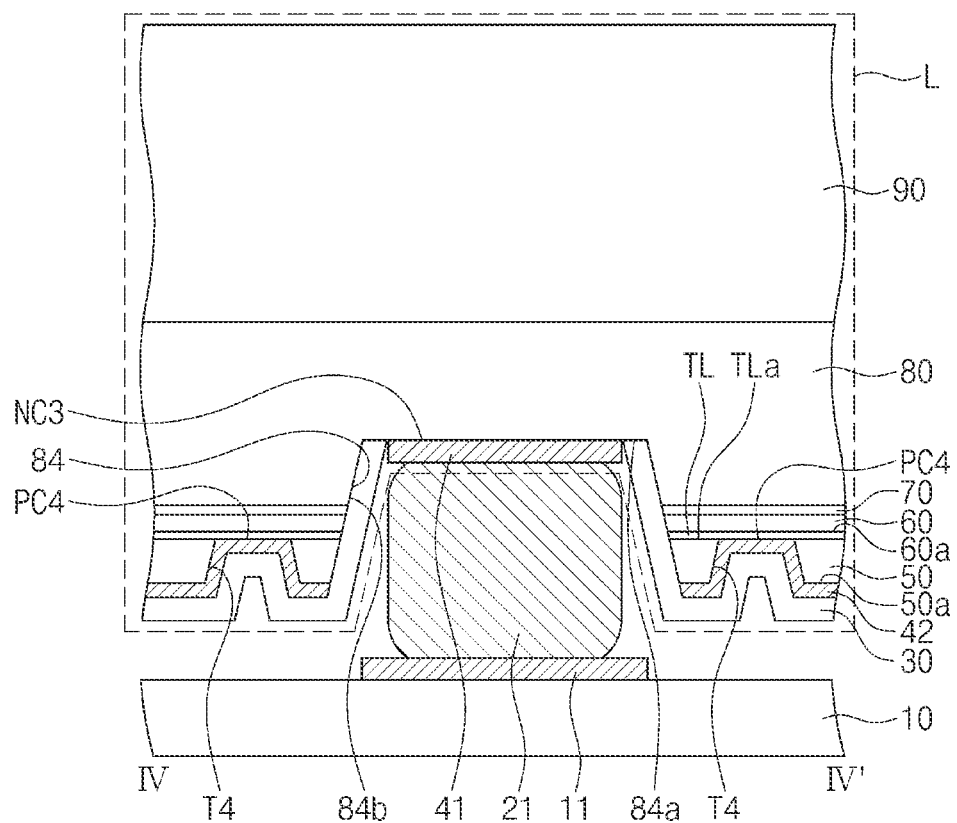
FIG. 8 illustrates a cross-sectional view taken along line IV-IV' of FIG. 7A or 7B.

FIG. 7A illustrates a plan view showing a light emitting module according to some example embodiments. FIG. 7B illustrates a plan view showing a light emitting module according to some example embodiments. FIG. 8 illustrates a cross-sectional view taken along line IV-IV' of FIG. 7A or 7B. A duplicate description will be omitted below.

Referring to FIGS. 7A and 8, a light emitting module 1 may include a substrate 10, a first solder bump 21, a second solder bump, and a light emitting device L. The substrate 10, the first solder bump 21, and the second solder bump may be substantially the same as those discussed above with reference to FIGS. 1 and 2.

The light emitting device L may include a growth substrate 90, a first semiconductor layer 80, an active layer 70, a second semiconductor layer 60, a transparent conductive layer TL, a dielectric layer 50, an insulating layer 30, a first electrode 41, and a second electrode 42. The growth substrate 90, the first semiconductor layer 80, the active layer 70, the second semiconductor layer 60, the transparent conductive layer TL, and the insulating layer 30 may be substantially the same as those discussed above with reference to FIGS. 1 and 2.

The dielectric layer 50 may be provided on the bottom surface TLa of the transparent conductive layer TL. The dielectric layer 50 may be etched such that fourth trenches T4 may further be included. The second electrode 42 may be provided on the bottom surface 50a of the dielectric layer 50 and the bottom surface TLa of the transparent conductive layer TL. For example, the second electrode 42 may conformally cover the bottom surface 50a of the dielectric layer 50, top and lateral surfaces of the fourth trenches T4, and the top and lateral surfaces of the second trenches T2. The second electrode 42 may contact the bottom surface TLa of the transparent conductive layer TL, thereby forming fourth p-contacts PC4.

When viewed in plan, edge regions of the first semiconductor layer 80, the active layer 70, the second semiconductor layer 60, the transparent conductive layer TL, and the dielectric layer 50 may be etched to form a first etching part 82. The first etching part 82 may be substantially the same as the first etching part 82 discussed above with reference to FIG. 1. Central regions of the first semiconductor layer 80, the active layer 70, the second semiconductor layer 60, the transparent conductive layer TL, and the dielectric layer 50 may be etched such that a second etching part 84 may further be formed. The second etching part 84 may have a top surface 84a and an inclined surface 84b. The first electrode 41 may be provided on the top surface 84a of the second etching part 84. The first electrode 41 may contact the first semiconductor layer 80, thereby forming a third n-contact NC3. The third n-contact contact NC3 may be a region where the first semiconductor layer 80 is electrically connected to the first electrode 41.

When viewed in plan, the third n-contact NC3 may be disposed on the central region of the light emitting device L. For example, on the central region, the third n-contact NC3 may be disposed adjacent to a location adjacent to one of the second sides S2. The third n-contact NC3 may have, for example, an elliptical shape. According to some example embodiments, the third n-contact NC3 may have a linear shape, a circular shape, or a polygonal shape.

The fourth p-contact PC4 may surround the third n-contact NC3. For example, the fourth p-contact PC4 may have an annular shape. The third n-contact NC3 may be disposed inside the annular shape. The fourth p-contact PC4 may be closer than one of the second p-contacts PC2 to the third n-contact NC3. The fourth p-contact PC4 may have an area greater than that of each of the second p-contacts PC2. In an example embodiment, as shown in FIG. 7B, the first n-contacts NC1 and the first p-contacts PC1 may be omitted. The second p-contacts PC2 may be disposed on regions where there are neither the first n-contacts NC1 nor the first p-contacts PC1.

Figure 9:
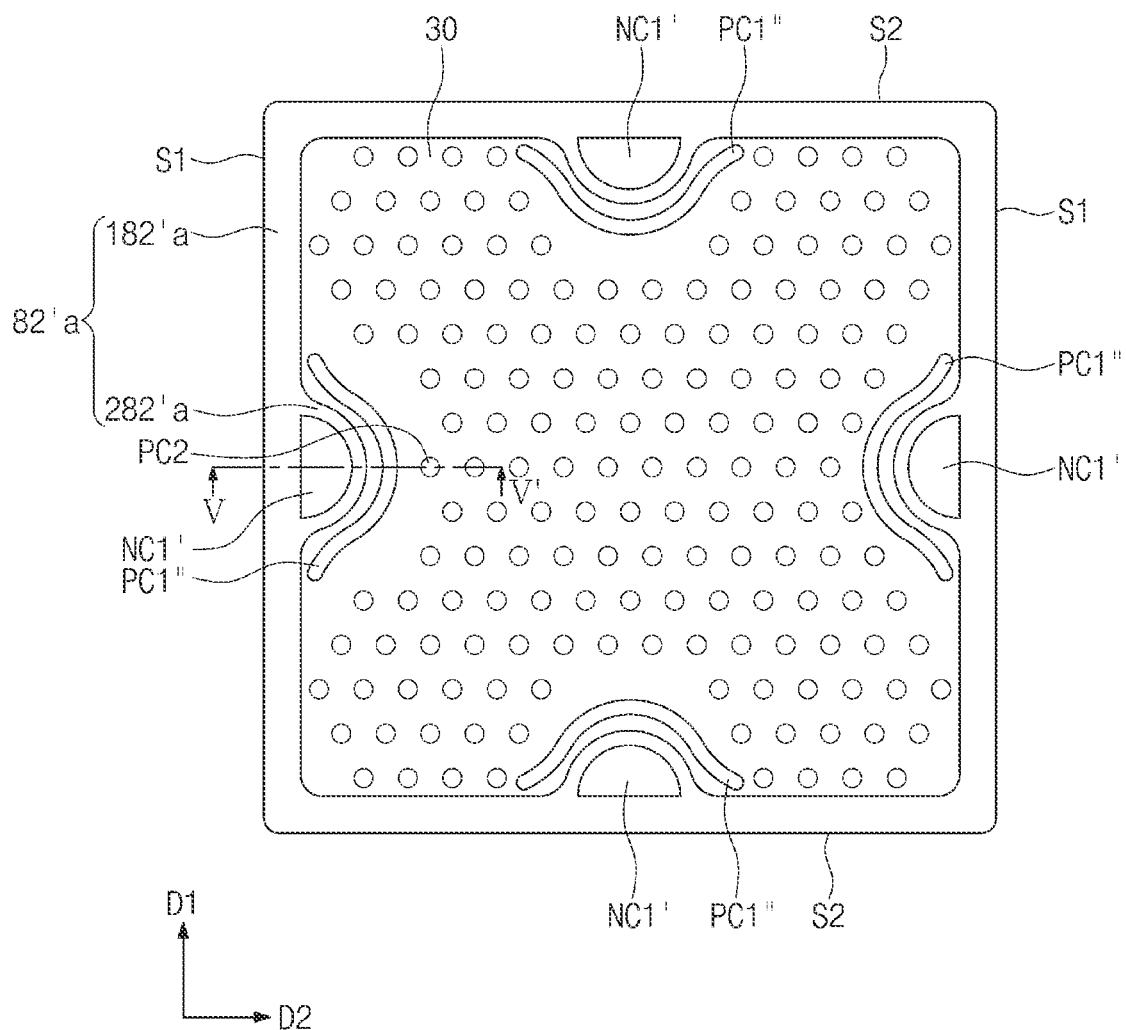
FIG. 9 illustrates a plan view showing a light emitting module according to some example embodiments.
Figure 10:
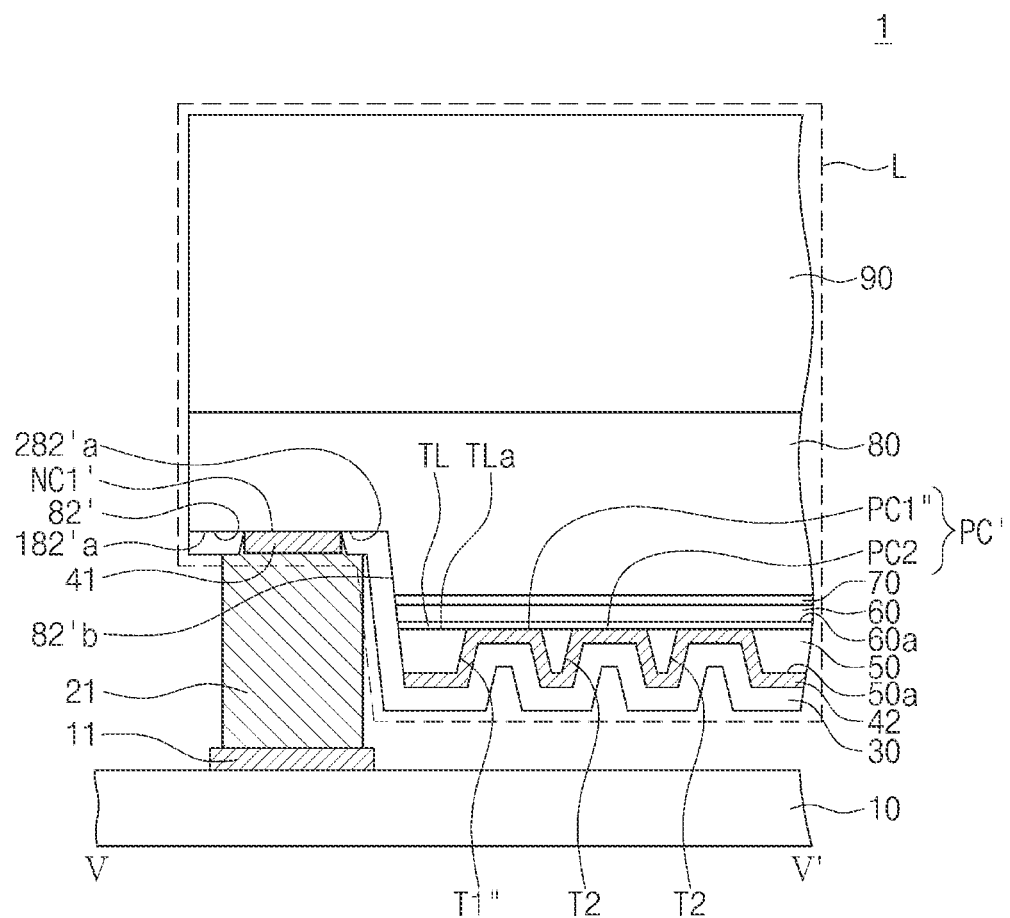
FIG. 10 illustrates a cross-sectional view taken along line V-V' of FIG. 9.

FIG. 9 illustrates a plan view showing a light emitting module according to some example embodiments. FIG. 10 illustrates a cross-sectional view taken along line V-V' of FIG. 9. A duplicate description will be omitted below.

Referring to FIGS. 9 and 10, a light emitting module 1 may include a substrate 10, a first solder bump 21, a second solder bump, and a light emitting device L. The substrate 10, the first solder bump 21, and the second solder bump may be substantially the same as those discussed above with reference to FIGS. 1 and 2.

The light emitting device L may include a growth substrate 90, a first semiconductor layer 80, an active layer 70, a second semiconductor layer 60, a transparent conductive layer TL, a dielectric layer 50, an insulating layer 30, a first electrode 41, and a second electrode 42. The growth substrate 90, the first semiconductor layer 80, the active layer 70, the second semiconductor layer 60, the transparent conductive layer TL, the dielectric layer 50, and the insulating layer 30 may be substantially the same as those discussed above with reference to FIGS. 1 and 2.

The dielectric layer 50 may be provided on the bottom surface TLa of the transparent conductive layer TL. The dielectric layer 50 may include a dielectric material. The dielectric layer 50 may be etched such that first trenches T1", and second trenches T2 may be included.

The second electrode 42 may be provided on the bottom surface 50a of the dielectric layer 50 and the bottom surface of the second semiconductor layer 60. For example, the second electrode 42 may conformally cover the bottom surface 50a of the dielectric layer 50, top and lateral surfaces of the first trenches T1", and the top and lateral surfaces of the second trenches T2. The second electrode 42 may contact the bottom surface TLa of the transparent conductive layer TL, thereby forming p-contacts PC'. The p-contacts PC' may include first p-contacts PC1" and second p-contacts PC2. The second electrode 42 may be electrically connected to the second semiconductor layer 60 through the first p-contacts PC1" and the second p-contacts PC2.

When viewed in plan, edge regions of the first semiconductor layer 80, the active layer 70, the second semiconductor layer 60, the transparent conductive layer TL, and the dielectric layer 50 may be etched to form a first etching part 82'. When viewed in plan, the first etching part 82' may surround the second semiconductor layer 60, the transparent conductive layer TL, the dielectric layer 50, and the active layer 70. The first etching part 82' may expose the inside of the first semiconductor layer 80, the lateral surface of the active layer 70, the lateral surface of the second semiconductor layer 60, the lateral surface of the transparent conductive layer TL, and the lateral surface of the dielectric layer 50. The first etching part 82' may have a top surface 82'a and an inclined surface 82'b. When viewed in plan, a top surface 82'a of the first etching part 82' may have a first region 182'a and a second region 282'a. The first region 182'a may be provided along an edge region of the light emitting device L and may have a rectangular ring shape. The second region 282'a may be connected to a part of the first region 182'a, and may protrude toward the central region of the light emitting device L. For example, as shown in FIG. 9, the second region 282'a may be disposed adjacent to a central portion of one of the second sides S2 or the first sides S1. The second region 282'a may have a semicircular shape when viewed in plan. The first electrode 41 may be provided on the second region 282'a of the top surface 82'a of the first etching part 82'. The first electrode 41 may contact the first semiconductor layer 80, thereby forming first n-contacts NC1'.

As shown in FIG. 9, the light emitting device L may have the first n-contacts NC1' and the p-contacts PC'. The p-contacts PC' may include first p-contacts PC1" and second p-contacts PC2. When viewed in plan, one of the first n-contacts NC1' may be disposed adjacent to one of either the first sides S1 or the second sides S2 of the light emitting device L. When viewed in plan, the one of the first n-contacts NC1' may be surrounded by the top surface 82'a of the first etching part 82'.

When viewed in plan, one of the first p-contacts PC1" may be disposed adjacent to the one of the first n-contacts NC1'. The one of the first p-contacts PC1" may have a streamline shape that partially surrounds the one of the first n-contacts NC1'. Therefore, the first n-contacts NC1' may be disposed between the one of the first p-contacts PC1" and the first region 182'a of the top surface 82'a of the first etching part 82'.

Figure 11A:
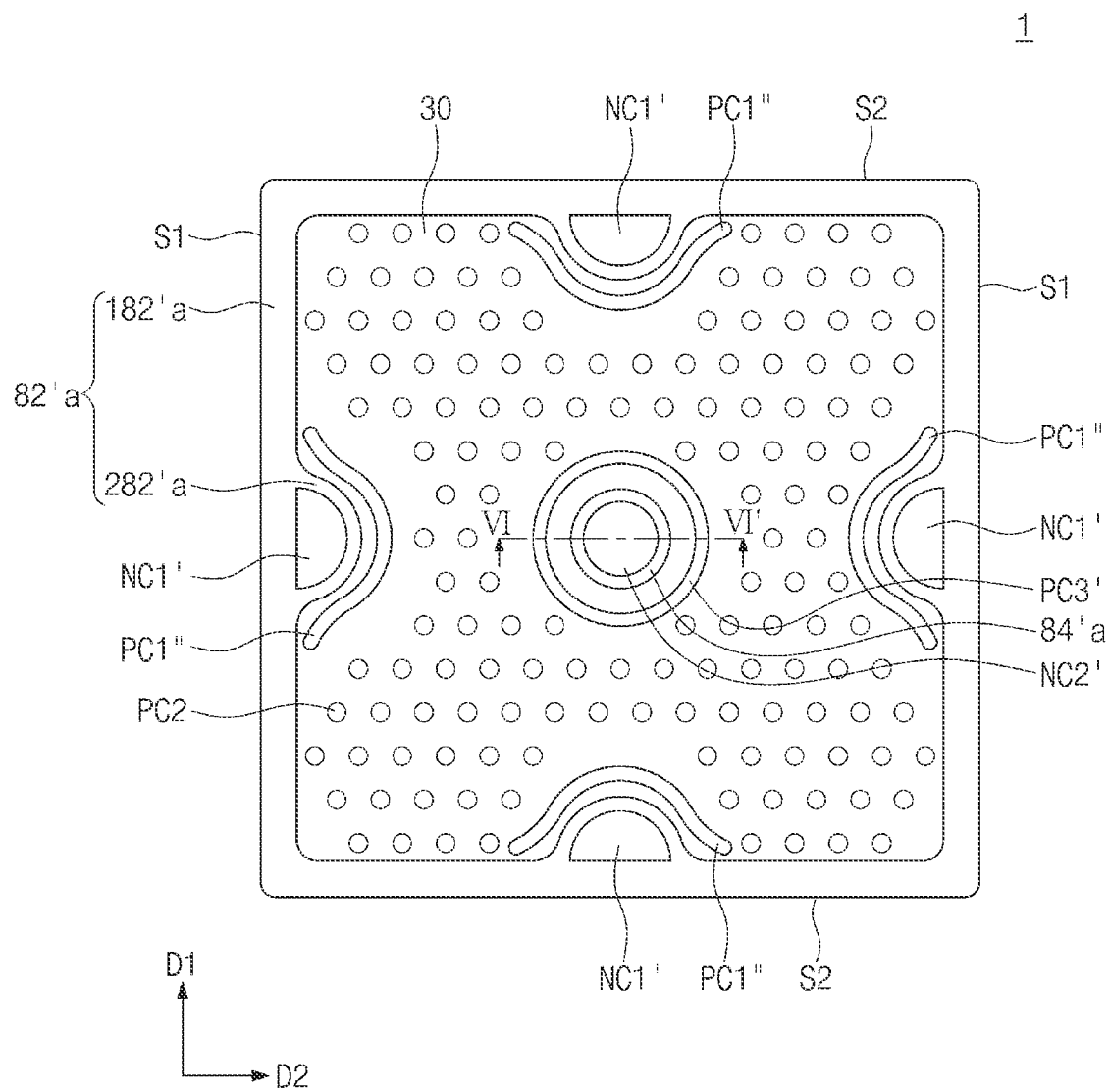
FIG. 11A illustrates a plan view showing a light emitting module according to some example embodiments.
Figure 11B:
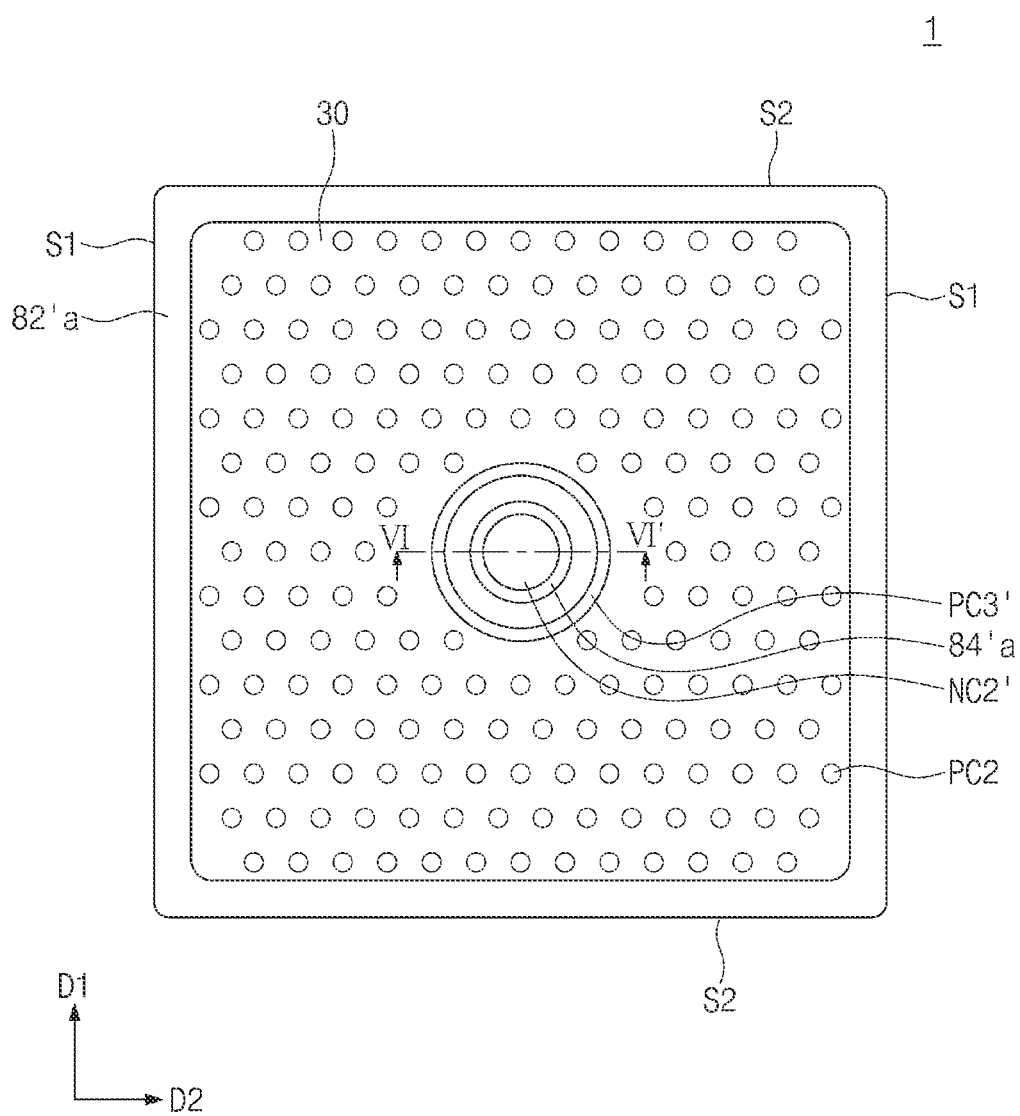
FIG. 11B illustrates a plan view showing a light emitting module according to some example embodiments.
Figure 12:
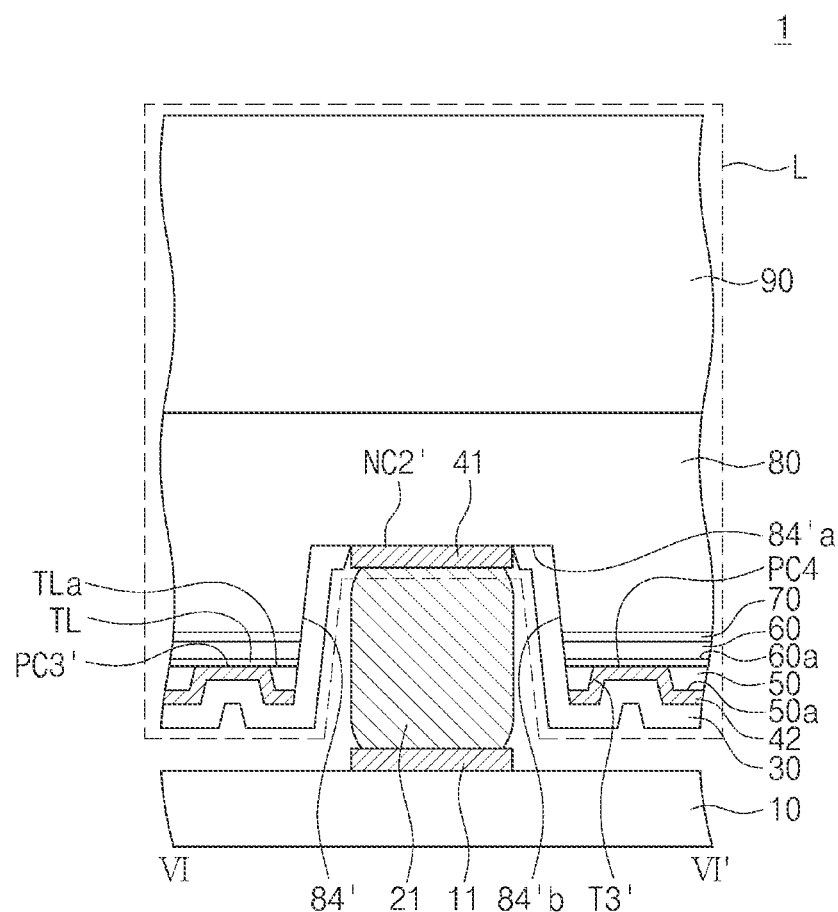
FIG. 12 illustrates a cross-sectional view taken along line VI-VI' of FIG. 11A or 11B.

FIG. 11A illustrates a plan view showing a light emitting module according to some example embodiments. FIG. 11B illustrates a plan view showing a light emitting module according to some example embodiments. FIG. 12 illustrates a cross-sectional view taken along line VI-VI' of FIG. 11A or 11B. A duplicate description will be omitted below.

Referring to FIGS. 11A and 11B, a light emitting module 1 may include a substrate 10, a first solder bump 21, a second solder bump, and a light emitting device L. The substrate 10, the first solder bump 21, and the second solder bump may be substantially the same as those discussed above with reference to FIGS. 1 and 2.

The light emitting device L may include a growth substrate 90, a first semiconductor layer 80, an active layer 70, a second semiconductor layer 60, a transparent conductive layer TL, a dielectric layer 50, an insulating layer 30, a first electrode 41, and a second electrode 42. The growth substrate 90, the first semiconductor layer 80, the active layer 70, the second semiconductor layer 60, the transparent conductive layer TL, and the insulating layer 30 may be substantially the same as those discussed above with reference to FIGS. 1 and 2.

The dielectric layer 50 may be provided on the bottom surface TLa of the transparent conductive layer TL. The dielectric layer 50 may be etched such that a third trench T3' may further be formed. The second electrode 42 may be provided on the bottom surface 50a of the dielectric layer 50 and the bottom surface TLa of the transparent conductive layer TL. For example, the second electrode 42 may conformally cover the bottom surface 50a of the dielectric layer 50, top and lateral surfaces of the third trenches T3', and the top and lateral surfaces of the second trenches T2. The second electrode 42 may contact the bottom surface TLa of the transparent conductive layer TL, thereby forming third p-contacts PC3'.

When viewed in plan, central regions of the first semiconductor layer 80, the active layer 70, the second semiconductor layer 60, the transparent conductive layer TL, and the dielectric layer 50 may be etched such that a second etching part 84' may further be formed. The second etching part 84' may have a top surface 84'a and an inclined surface 84'b. The first electrode 41 may be provided on the top surface 84'a of the second etching part 84'. The first electrode 41 may contact the first semiconductor layer 80, thereby forming second n-contacts NC2'.

When viewed in plan, the second n-contact NC2' may be disposed on the central region of the light emitting device L. The second n-contact NC2' may have, for example, a circular shape. According to some example embodiments, the second n-contact NC2' may have a linear shape, a circular shape, or a polygonal shape. The third p-contact PC3' may surround the second n-contact NC2'. For example, the third p-contacts PC3' may have an annular shape. The second n-contact NC2' may be disposed inside the annular shape. The third p-contact PC3' may be closer than one of the second p-contacts PC2 to the second n-contact NC2'. The third p-contact PC3' may have an area greater than that of each of the second p-contacts PC2. In an example embodiment, as shown in FIG. 11B, the first n-contacts NC1' and the first p-contacts PC1" may be omitted. The second p-contacts PC2 may be disposed on regions where there are neither the first n-contacts NC1' nor the first p-contacts PC1".

Figure 13:
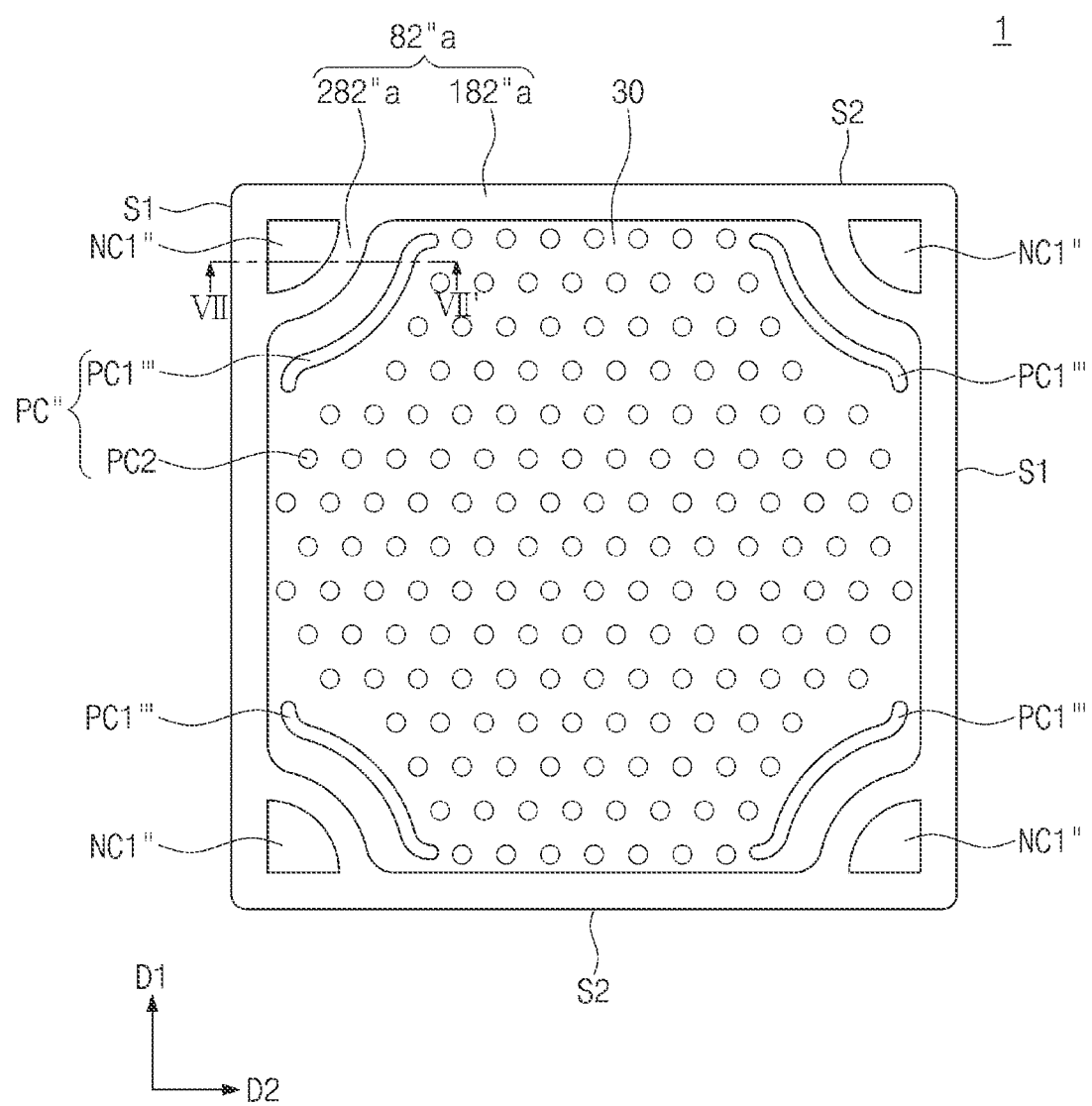
FIG. 13 illustrates a plan view showing a light emitting module according to some example embodiments.
Figure 14:
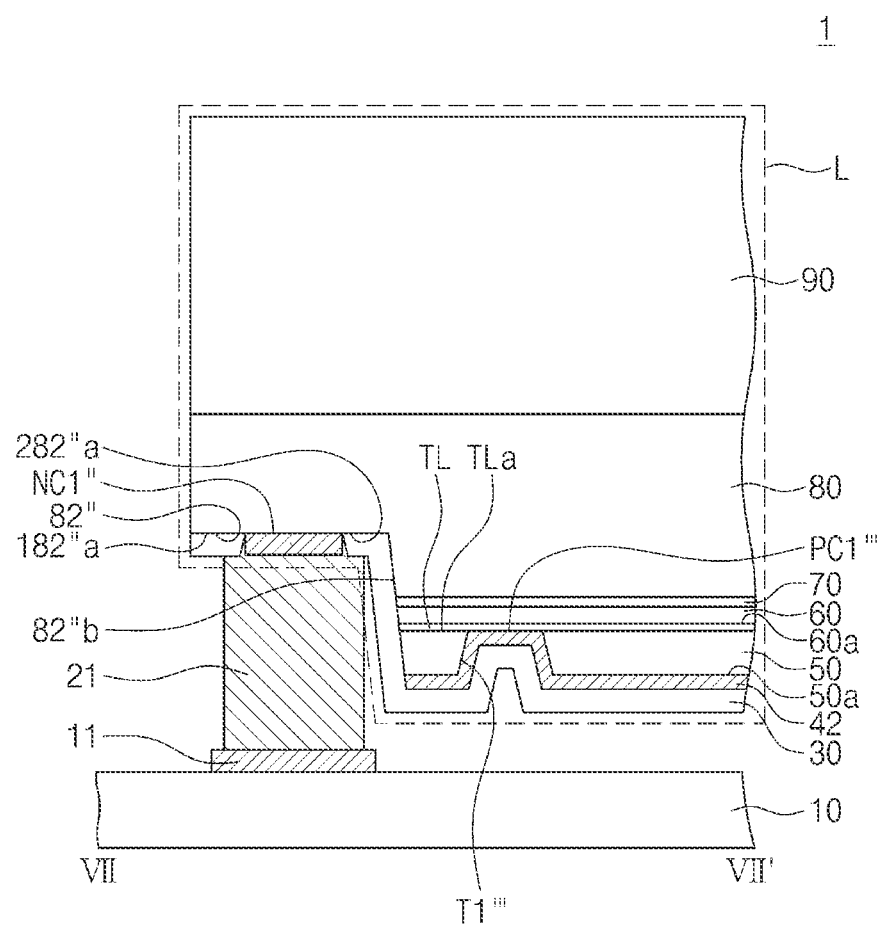
FIG. 14 illustrates a cross-sectional view taken along line VII-VII' of FIG. 13.

FIG. 13 illustrates a plan view showing a light emitting module according to some example embodiments. FIG. 14 illustrates a cross-sectional view taken along line VII-VII' of FIG. 13. A duplicate description will be omitted below.

Referring to FIGS. 13 and 14, a light emitting module 1 may include a substrate 10, a first solder bump 21, a second solder bump, and a light emitting device L. The substrate 10, the first solder bump 21, and the second solder bump may be substantially the same as those discussed above with reference to FIGS. 1 and 2.

The light emitting device L may include a growth substrate 90, a first semiconductor layer 80, an active layer 70, a second semiconductor layer 60, a transparent conductive layer TL, a dielectric layer 50, an insulating layer 30, a first electrode 41, and a second electrode 42. The growth substrate 90, the first semiconductor layer 80, the active layer 70, the second semiconductor layer 60, the transparent conductive layer TL, and the insulating layer 30 may be substantially the same as those discussed above with reference to FIGS. 1 and 2.

The dielectric layer 50 may be provided on the bottom surface TLa of the transparent conductive layer TL. The dielectric layer 50 may be etched such that first trenches T1''' and second trenches may be included. The second trenches may be substantially the same as those discussed above with reference to FIGS. 1 and 2.

The second electrode 42 may be provided on the bottom surface 50a of the dielectric layer 50 and the bottom surface TLa of the transparent conductive layer TL. For example, the second electrode 42 may conformally cover the bottom surface 50a of the dielectric layer 50 and top and lateral surfaces of the first trenches T1'''. The second electrode 42 may contact the bottom surface TLa of the transparent conductive layer TL, thereby forming first p-contacts PC1'''. The second electrode 42 may be electrically connected through the first p-contacts PC1''' to the second semiconductor layer 60.

When viewed in plan, edge regions of the first semiconductor layer 80, the active layer 70, the second semiconductor layer 60, the transparent conductive layer TL, and the dielectric layer 50 may be etched to form a first etching part 82". When viewed in plan, the first etching part 82" may surround the second semiconductor layer 60, the dielectric layer 50, the transparent conductive layer TL, and the active layer 70. The first etching part 82" may expose the inside of the first semiconductor layer 80, the lateral surface of the active layer 70, the lateral surface of the second semiconductor layer 60, the lateral surface of the transparent conductive layer TL, and the lateral surface of the dielectric layer 50. The first etching part 82" may have a top surface 82"a and an inclined surface 82"b. When viewed in plan, the top surface 82"a of the first etching part 82" may have a first region 182"a and a second region 282"a. The first region 182"a may be provided along the edge region of the light emitting device L and may have a rectangular ring shape. The second region 282"a may be connected a part of the first region 182"a, and may protrude toward the central region of the light emitting device L. For example, as shown in FIG. 13, the second region 282"a may be disposed adjacent to a corner where one of the second sides S2 meets one of the first sides S1. The second region 282"a may have a sector shape when viewed in plan. The first electrode 41 may be provided on the second region 282"a of the top surface 82"a of the first etching part 82". The first electrode 41 may contact the first semiconductor layer 80, thereby forming first n-contacts NC1".

As shown in FIG. 13, the light emitting device L may have the first n-contacts NC1" and p-contacts PC". The p-contacts PC" may include first p-contacts PC1''' and second p-contacts PC2. When viewed in plan, one of the first n-contacts NC1" may be disposed adjacent to a point where one of the first sides S1 meets one of the second sides S2 of the light emitting device L. When viewed in plan, the one of the first n-contacts NC1" may be surrounded by the top surface 82"a of the first etching part 82". The one of the first n-contacts NC1" may have a sector shape. When viewed in plan, one of the first p-contacts PC1''' may be disposed adjacent to the one of the first n-contacts NC1". The one of the first p-contacts PC1''' may have a streamline shape that partially surrounds the one of the first n-contacts NC1". Therefore, the first n-contacts NC1" may be disposed between one of the first p-contacts PC1''' and the first region 182"a of the top surface 82"a of the first etching part 82".

According to some embodiments, a light emitting device may include p-contacts where a first semiconductor layer is in contact with a first electrode and also include n-contacts where a second semiconductor layer is in contact with a second electrode. A failure due to high current density may occur at some p-contacts closest to the n-contacts. The some p-contacts closest to the n-contacts may be variously changed in shape, when viewed in plan, to reduce the high current density. For example, the p-contacts closest to the n-contacts may have increased areas to reduce density of current flowing through the p-contacts. Accordingly, it may be possible to achieve a light emitting device with increased reliability.

While example embodiments have been shown and described above, it will be apparent to those skilled in the art that various combinations, modifications and variations may be made without departing from the spirit and scope of the present disclosure as defined by the appended claims.

What is claimed is:

1. A light emitting device, comprising:
a first semiconductor layer;
a second semiconductor layer on the first semiconductor layer;
an active layer interposed between the first semiconductor layer and the second semiconductor layer;
a dielectric layer on the second semiconductor layer;
an n-contact on the first semiconductor layer; and
a plurality of p-contacts comprising a first p-contact and a plurality of second p-contacts on the second semiconductor layer,
wherein the first p-contact is closer to the n-contact than the plurality of second p-contacts,
wherein no p-contact is between the first p-contact and the n-contact, and
wherein, when viewed in plan, an area of the first p-contact is greater than an area of each of the plurality of second p-contacts.

2. The light emitting device of claim 1, wherein the n-contact is disposed adjacent an edge of the light emitting device.

3. The light emitting device of claim 2, further comprising another n-contact disposed adjacent another edge opposite to the edge of the light emitting device with respect to a central line.

4. The light emitting device of claim 3, wherein the other n-contact is symmetrical to the n-contact with respect to the central line of the light emitting device.

5. The light emitting device of claim 1, further comprising another first p-contact symmetrical to the first p-contact with respect to a central line of the light emitting device.

6. The light emitting device of claim 1, wherein the n-contact is disposed adjacent a center of the light emitting device.

7. The light emitting device of claim 1, wherein the n-contact is surrounded by the active layer, the second semiconductor layer, and the first p-contact.

8. The light emitting device of claim 1, wherein, when viewed in plan, the first p-contact has a linear shape extending along a circumference of the n-contact.

9. The light emitting device of claim 8, wherein a distance between the first p-contact and the n-contact ranges from 1 μm to 100 μm.

10. A light emitting device, comprising:
a first semiconductor layer including a recessed region and a mesa region;
a second semiconductor layer on the mesa region of the first semiconductor layer, the second semiconductor layer exposing the recessed region of the first semiconductor layer;
an active layer interposed between the first semiconductor layer and the second semiconductor layer;
a dielectric layer on the second semiconductor layer, the dielectric layer having a plurality of contact holes comprising a first contact hole and a plurality of second contact holes;
a first electrode on the first semiconductor layer in the recessed region;
a second electrode on the dielectric layer;
an insulating layer on the second electrode, and on the first semiconductor layer in the recessed region, the insulating layer covering an inclined side surface of the first semiconductor layer, the active layer and the second semiconductor layer, the insulating layer having a first through hole in the recessed region and a second through hole in the mesa region;
an n-contact where the first electrode is connected to the first semiconductor layer through the first through hole in the recessed region; and
a plurality of p-contacts comprising a first p-contact where the second electrode is connected to the second semiconductor layer through the first contact hole, and a plurality of second p-contacts where the second electrode is connected to the second semiconductor layer through the plurality of second contact holes in the mesa region,
wherein the first p-contact is closer to the n-contact than the plurality of second p-contacts,
wherein no p-contact is between the first p-contact and the n-contact, and
wherein, when viewed in plan, an area of the first p-contact is greater than an area of each of the plurality of second p-contacts.

11. The light emitting device of claim 10, wherein, when viewed in plan, the recessed region surrounds the mesa region.

12. The light emitting device of claim 11, wherein, when viewed in plan, the n-contact is disposed adjacent a center of a first side of the light emitting device.

13. The light emitting device of claim 11, wherein, when viewed in plan, the n-contact has a straight line shape.

14. The light emitting device of claim 10, wherein, when viewed in plan, the mesa region surrounds the recessed region.

15. The light emitting device of claim 14, wherein the n-contact has a circular shape, and
wherein the p-contact has a circular ring shape.

16. A light emitting device, comprising:
a first semiconductor layer;
a second semiconductor layer on the first semiconductor layer;
an active layer interposed between the first semiconductor layer and the second semiconductor layer;
a dielectric layer on the second semiconductor layer;
a plurality of n-contacts on the first semiconductor layer; and
a plurality of p-contacts comprising a plurality of first p-contacts and a plurality of second p-contacts on the second semiconductor layer,
wherein each of the plurality of first p-contacts is closer to a corresponding one of the plurality of n-contacts than each of the plurality of second p-contacts,
wherein no p-contact is between each of the plurality of first p-contacts and the corresponding one of the plurality of n-contacts, and
wherein, when viewed in plan, an area of each of the plurality of first p-contacts is greater than an area of each of the plurality of second p-contacts.

17. The light emitting device of claim 16, wherein the plurality of n-contacts comprise first and second edge n-contacts respectively disposed adjacent opposite edges of the light emitting device.

18. The light emitting device of claim 17, wherein the plurality of n-contacts further comprises an inner n-contact surrounded by the active layer and the second semiconductor layer.

19. The light emitting device of claim 16, wherein, when viewed in plan, each of the plurality of first p-contacts has a linear shape extending while maintaining substantially same distance from the corresponding one of the plurality of n-contacts.

20. The light emitting device of claim 19, wherein the distance between each of the plurality of first p-contacts and the corresponding one of the plurality of n-contacts ranges from 1 μm to 100 μm.

* * * * *